(12) United States Patent
Seol et al.

(10) Patent No.: US 8,159,017 B2
(45) Date of Patent: Apr. 17, 2012

(54) NON-VOLATILE MEMORY DEVICE AND METHOD OF MANUFACTURING THE SAME

(75) Inventors: Kwang-soo Seol, Yongin-si (KR);
Yoon-dong Park, Yongin-si (KR);
Suk-pil Kim, Yongin-si (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 385 days.

(21) Appl. No.: 12/385,201

(22) Filed: Apr. 1, 2009

(65) Prior Publication Data
US 2009/0251963 A1 Oct. 8, 2009

(30) Foreign Application Priority Data
Apr. 3, 2008 (KR) .......................... 10-2008-0031365

(51) Int. Cl.
*H01L 29/76* (2006.01)
(52) U.S. Cl. .................... 257/314; 257/315; 365/185.05
(58) Field of Classification Search .................. 257/314, 257/315; 365/185.05
See application file for complete search history.

(56) References Cited

U.S. PATENT DOCUMENTS

| | | | | |
|---|---|---|---|---|
| 6,888,750 B2 * | 5/2005 | Walker et al. | ............ | 365/185.05 |
| 6,940,109 B2 * | 9/2005 | Patel et al. | ..................... | 257/213 |
| 6,992,349 B2 * | 1/2006 | Lee et al. | ...................... | 257/324 |

* cited by examiner

*Primary Examiner* — Son Dinh
(74) *Attorney, Agent, or Firm* — Harness, Dickey & Pierce, P.L.C.

(57) ABSTRACT

A multi-layered non-volatile memory device and a method of manufacturing the same. The non-volatile memory device may include a plurality of first semiconductor layers having a stack structure. A plurality of control gate electrodes may extend across the first semiconductor layers. A first body contact layer may extend across the first semiconductor layers. A plurality of charge storage layers may be interposed between the control gate electrodes and the first semiconductor layers.

9 Claims, 16 Drawing Sheets

NON-VOLATILE MEMORY DEVICE AND METHOD OF MANUFACTURING THE SAME

PRIORITY STATEMENT

This application claims the benefit of Korean Patent Application No. 10-2008-0031365, filed on Apr. 3, 2008, in the Korean Intellectual Property Office, the disclosure of which is incorporated herein in its entirety by reference.

BACKGROUND

1. Field

Example embodiments relate to a semiconductor device, for example, to a non-volatile memory device capable of recording and/or erasing data and a method of manufacturing the non-volatile memory device.

2. Description of the Related Art

Semiconductor products are demanded to be smaller and faster. As a result, non-volatile memory devices used in semiconductor products require a high level of integration and efficiency. Moreover, as integration of non-volatile memory devices increase, distances between memory cells of the non-volatile memory devices are reduced, thereby potentially causing increases in electrical interference between neighboring memory cells. Due to limitations of integration technology, general planar-type non-volatile memory devices have limited capacity and speed. Also, difficulty remains in reducing interference between neighboring memory cells.

In order to significantly increase integration of non-volatile memory devices, a multi-layer stack structure has been suggested. For example, if a plurality of memory cells are stacked, a non-volatile memory device with larger capacity may be manufactured on the same footprint.

SUMMARY

According to example embodiments, there is provided a non-volatile memory device that may include a plurality of first semiconductor layers having a stack structure, a plurality of control gate electrodes extending across the first semiconductor layers, a plurality of first body contact layers extending across the first semiconductor layers to contact a surface of the first semiconductor layers opposite to that facing the control gate electrodes, and/or a plurality of charge storage layers between the control gate electrodes and the first semiconductor layers.

Example embodiments may further include a plurality of device isolating layers interposed between the first semiconductor layers and contacting the first body contact layers.

According to example embodiments, a plurality of second semiconductor layers may be disposed at a side of the control gate electrodes opposite to that facing the first semiconductor layers.

According to example embodiments, a plurality of second body contact layers, extending across the second semiconductor layers to contact a surface of the second semiconductor layers opposite to that facing the control gate electrodes, may be provided.

According to example embodiments, a plurality of tunneling insulation layers may be interposed between the charge storage layers and the first and the second semiconductor layers, and a plurality of blocking insulation layers may be interposed between the charge storage layers and/or the control gate electrodes.

According to example embodiments, the charge storage layers may be disposed to surround the control gate electrodes, and/or the tunneling insulation layers may be connected to each other.

According to example embodiments, there is provided a non-volatile memory device including a cell array unit having a stack structure arranged in a plurality of layers, a row decoder connected to a plurality of wordlines in the cell array unit, an operating layer selecting unit connected to a plurality of bitlines in the cell array unit, and a page buffer connected to the bitlines via the operating layer selecting unit, wherein the operating layer selecting unit connects only bitlines connected to one or more selected layers among a plurality of layers in the cell array unit to the page buffer.

The operating layer selecting unit may include a pre-charging unit charging the bitlines with a boosting voltage in advance, and/or the operating layer selecting unit may include a layer control unit for controlling electrical connections between the bitlines and the page buffer.

According to example embodiments, the operating layer selecting unit may further include an even/odd selecting unit for distinguishing bitlines disposed on the same layer into even bitlines and/or odd bitlines.

According to example embodiments, there is provided a method of manufacturing a non-volatile memory device, the method may include forming a plurality of first semiconductor layers having a stack structure, forming a first body contact layer across the first semiconductor layers to connect the first semiconductor layers to each other, forming a plurality of charge storage layers on sidewalls of the first semiconductor layers opposite to those contacting the first body contact layer, and/or forming a plurality of control gate electrodes to extend across the first semiconductor layers on the charge storage layers.

The first semiconductor layers may be formed such that a plurality of device isolating layers are interposed between the first semiconductor layers. Furthermore, the first semiconductor layers may be formed using an epitaxial lateral overgrowth (ELO) method such that the first semiconductor layers extend onto the device isolating layers.

According to example embodiments, a vertical epitaxial layer, perpendicular to the first semiconductor layers may be formed on sidewalls of the device isolating layers simultaneously to the formation of the first semiconductor layers. Furthermore, the control gate electrodes may be formed in a trench formed by removing the vertical epitaxial layer.

According to example embodiments, a plurality of second semiconductor layers may be formed at a side of the vertical epitaxial layer opposite to that facing the first semiconductor layers prior to the formation of the charge storage layers.

According to example embodiments, the first body contact layer may be the vertical epitaxial layer and the control gate electrodes may be formed to connect the first semiconductor layers opposite to the vertical epitaxial layer.

BRIEF DESCRIPTION OF THE DRAWINGS

The above and other features and advantages will become more apparent by describing in detail example embodiments thereof with reference to the attached drawings in which.

DETAILED DESCRIPTION OF EXAMPLE EMBODIMENTS

Figure 1:
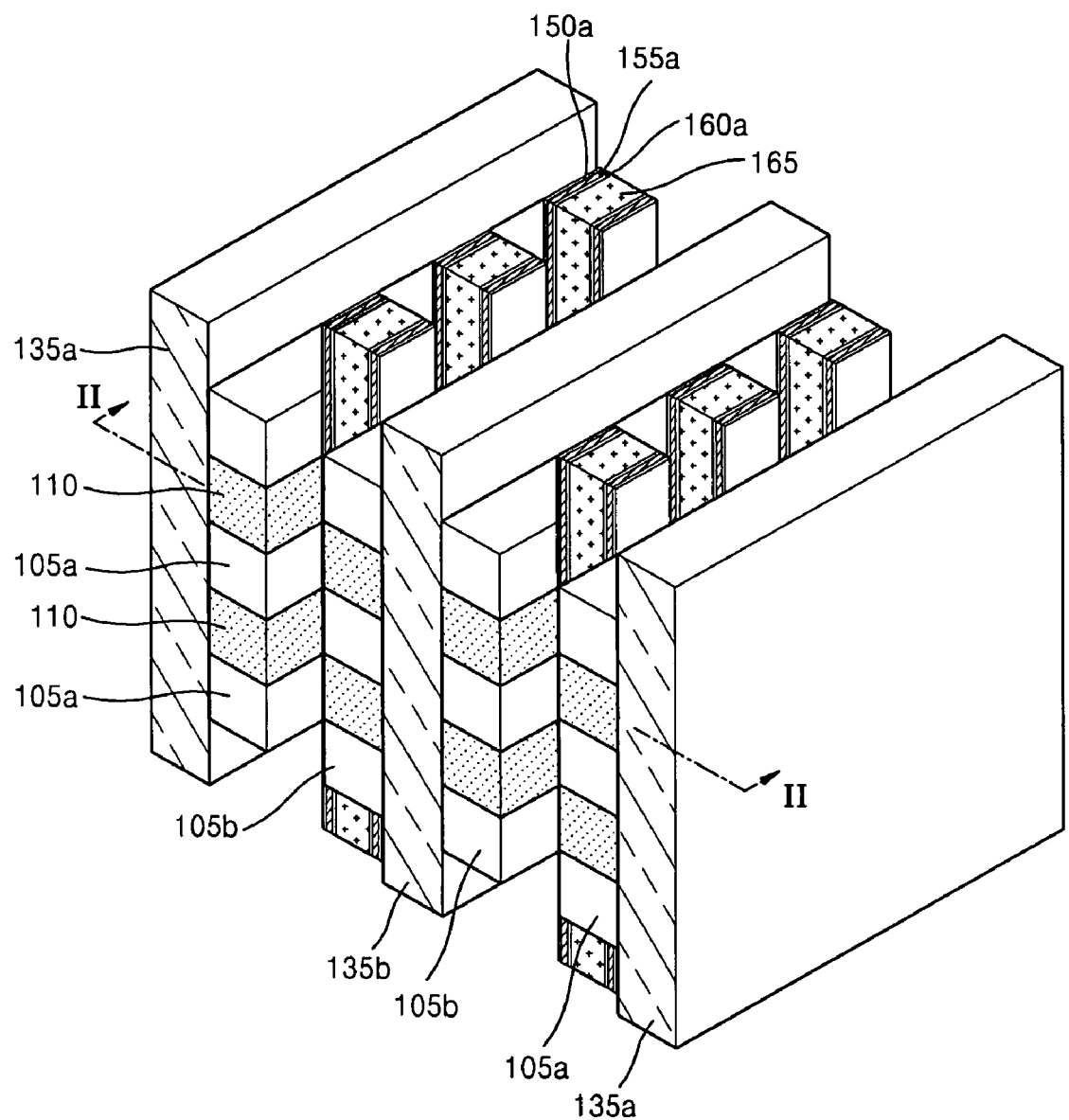
FIG. 1 illustrates a non-volatile memory device according to example embodiments.

Example embodiments will now be described more fully with reference to the accompanying drawings, in which example embodiments are shown. Example embodiments may, however, be embodied in many different forms and should not be construed as being limited to the example embodiments set forth herein; rather, example embodiments are provided so that this disclosure will be thorough and complete, and will fully convey the concept of the invention to those skilled in the art. Like reference numerals in the drawings denote like elements, and thus, their description may not be repeated.

Example embodiments of the present invention will be more clearly understood from the detailed description taken in conjunction with the accompanying drawings.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Also, the use of the words "compound," "compounds," or "compound(s)," refer to either a single compound or to a plurality of compounds. These words are used to denote one or more compounds but may also just indicate a single compound.

Now, in order to more specifically describe example embodiments of the present invention, various embodiments of the present invention will be described in detail with reference to the attached drawings. However, the present invention is not limited to the example embodiments, but may be embodied in various forms. In the figures, if a layer is formed on another layer or a substrate, it means that the layer is directly formed on another layer or a substrate, or that a third layer is interposed therebetween. In the following description, the same reference numerals denote the same elements.

Although the example embodiments of the present invention have been disclosed for illustrative purposes, those skilled in the art will appreciate that various modifications, additions and substitutions are possible, without departing from the scope and spirit of the invention as disclosed in the accompanying claims.

Figure 2:
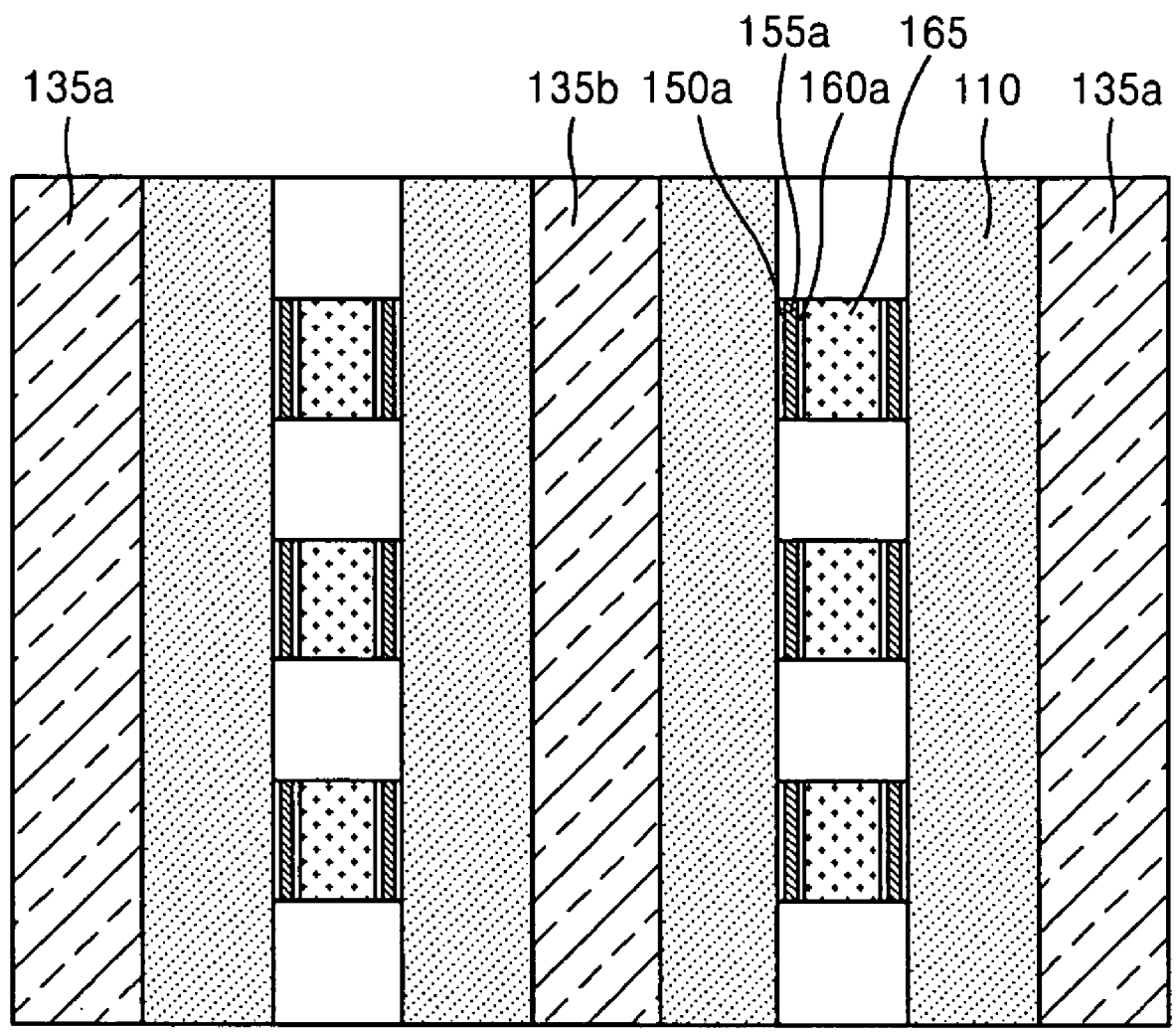
FIG. 2 is a top view of the non-volatile memory device of FIG. 1, taken along a II-II' line of FIG. 1.

FIG. 1 illustrates a non-volatile memory device according to example embodiments, and FIG. 2 is a top view of the non-volatile memory device of FIG. 1, taken along a II-II' line of FIG. 1.

Referring to FIGS. 1 and 2, a plurality of first semiconductor layers 105a and/or a plurality of second semiconductor layers 105b may be in a stacked structure. The first semiconductor layers 105a and/or the second semiconductor layers 105b may be provided as single crystal layers, and more particularly, epitaxial layers grown on a single crystal substrate, for example. Stack structures of the first semiconductor layers 105a and stack structures of the second semiconductor layers 105b may be disposed alternately. Alternatively, either the stack structures of the first semiconductor layers 105a or the stack structures of the second semiconductor layers 105b may be omitted. Also, any number of the first semiconductor layers 105a and/or the second semiconductor layers 105b can be stacked in the corresponding stack structures. Thus, the number of stacked layers are not limited in example embodiments.

The first semiconductor layers 105a and/or the second semiconductor layers 105b may be formed of a suitable semiconductor material; i.e. silicon, germanium, or silicon germanium. However, example embodiments are not limited thereto. For example, the first semiconductor layers 105a and the second semiconductor layers 105b may be formed of the same semiconductor material.

The first semiconductor layers 105a may be stacked by alternately interposing a plurality of device isolating layers 110 therebetween, and/or the second semiconductor layers 105b may be stacked by alternately interposing a plurality of the device isolating layers 110 therebetween. The device isolating layers 110 may be formed of a suitable insulating material, and example embodiments may not be limited to the insulation material.

A plurality of control gate electrodes 165 may be provided such that the control gate electrodes 165 extend across the first semiconductor layers 105a and/or the second semiconductor layers 105b. For example, the control gate electrodes 165 may be arranged in a plurality of vertical penetration structures between the first semiconductor layers 105a and the second semiconductor layers 105b. In this case, the control gate electrodes 165 may be coupled with the first semiconductor layers 105a and the second semiconductor layers 105b in a NAND-type structure. However, example embodiments are not limited thereto, and the arrangement of the control gate electrodes 165 may vary.

One or more first body contact layers 135a may be provided to connect a surface of the first semiconductor layers 105a opposite to that facing the control gate electrodes 165, and/or one or more second body contact layers 135b may be provided to connect a surface of the second semiconductor layers 105b opposite to that facing the control gate electrodes 165. For example, the one or more first body contact layers 135a may extend across the first semiconductor layers 105a, and the one or more second body contact layers 135b may extend across the second semiconductor layers 105b.

The one or more first body contact layers 135a may be provided to apply body bias to the first semiconductor layers 105a, and the one or more second body contact layers 135b may be provided to apply body bias to the second semiconductor layers 105b. The one or more first body contact layers 135a and the one or more second body contact layers 135b may be formed of a conductive material. For example, the one or more first body contact layers 135a and the one or more second body contact layers 135b may be formed of the same material. Also, the first and the second body contact layers 135a and 135b may be either formed of the same material as the first and the second semiconductor layers 105a and 105b or formed of a material different from that of the first and the second semiconductor layers 105a and 105b.

Sidewalls of the device isolating layers 110 may contact the first body contact layer 135a and the second body contact layer 135b. Accordingly, the device isolating layers 110 may be disposed between the control gate electrodes 165 and the first and the second body contact layers 135a and 135b respectively.

A plurality of charge storage layers 155a may be interposed between the first semiconductor layers 105a and the control gate electrodes 165 and/or between the second semiconductor layers 105b and the control gate electrodes 165. The charge storage layers 155a may be used as a charge storage medium for data programming. Accordingly, the charge storage layers 155a may be floating-gate type charge storage layers or a charge-trapping type charge storage layers.

For example, the floating-gate type charge storage layers may include a conductor such as poly-silicon layers, whereas the charge-trapping type charge storage layers may include silicon-nitride layers, quantum dots, or nanocrystals. The quantum dots or the nanocrystals may be formed of fine particles of a conductor such as a metal or a semiconductor. The charge-trapping type charge storage layers can locally store charges, and thus the charge-trapping type charge storage layers can be used for multi-bit operation of a non-volatile memory device.

A plurality of tunnelling insulation layers 150a may be interposed between the first semiconductor layers 105a and the charge storage layers 155a and/or the second semiconductor layers 105b and the charge storage layers 155a. A plurality of blocking insulation layers 160a may be interposed between the charge storage layers 155a and the control gate electrodes 165. The tunnelling insulation layers 150a and the blocking insulation layers 160a may be formed of suitable insulation materials such as oxides, nitrides, or high dielectric materials. The tunnelling insulation layers 150a and the blocking insulation layers 160a may also include structures in which a plurality of the insulation materials are stacked.

In the non-volatile memory device according to example embodiments, the control gate electrodes 165 can be combined with the first semiconductor layers 105a and/or the second semiconductor layers 105b to form memory cells. Thus, the memory cells formed in both cases can be arranged in either a multi-layer structure or a stack structure while sharing the control gate electrodes 165. Accordingly, the integration of the non-volatile memory device may be improved by increasing the number of stacked layers of the first semiconductor layers 105a and/or the second semiconductor layers 105b. Thus, the non-volatile memory device according to example embodiments may have a higher capacity. Moreover, body bias may be applied to the first and the second semiconductor layers 105a and 105b having stack structures by using the first and the second body contact layers 135a and 135b. The body bias may be used for controlling threshold voltages of memory cells or for erasing data of memory cells simultaneously. Therefore, the non-volatile memory device according to example embodiments may exhibit a high level of performance.

Figure 3:
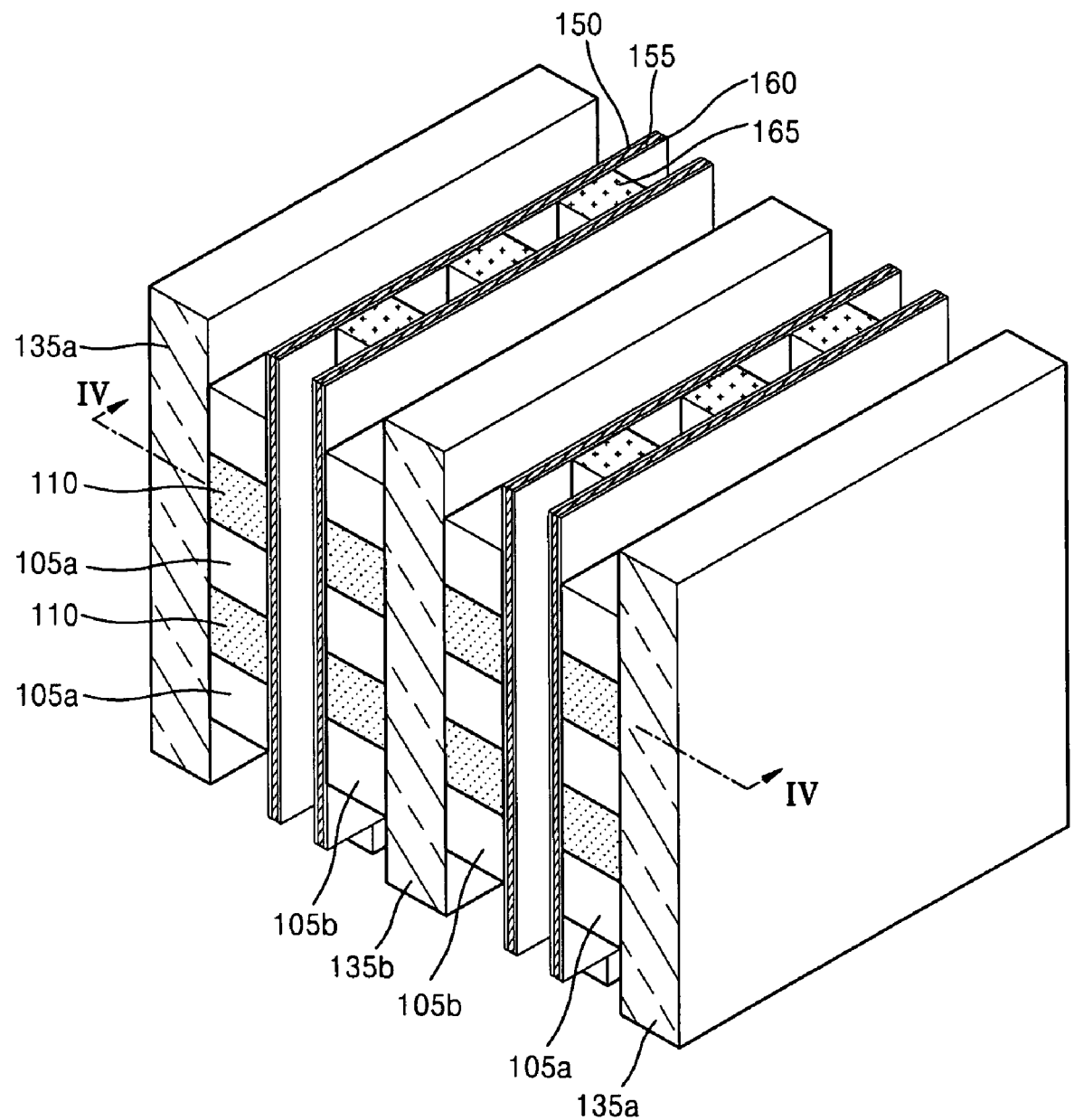
FIG. 3 illustrates a non-volatile memory device according to example embodiments.
Figure 4:
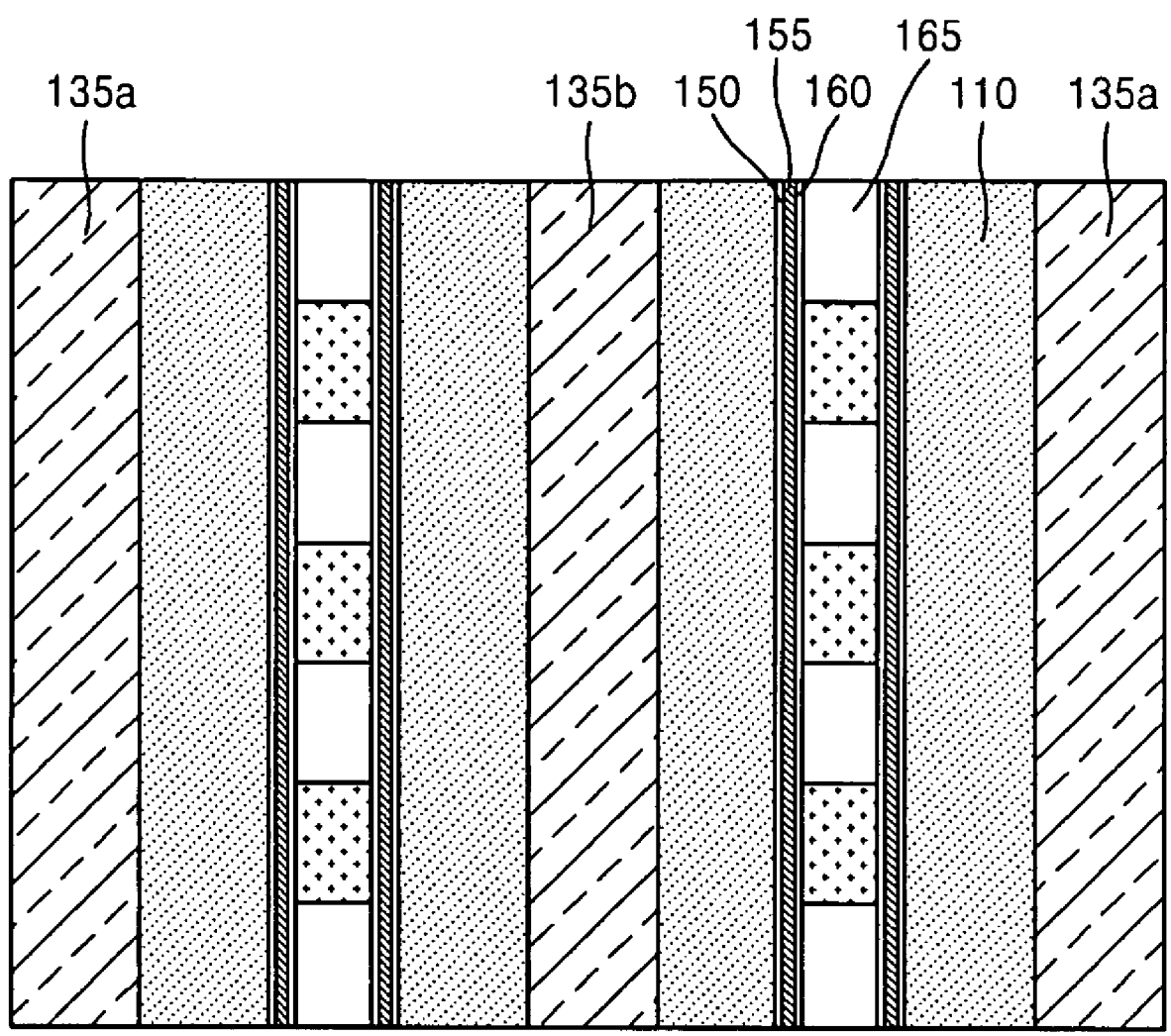
FIG. 4 is a cross-sectional view taken along a line IV-IV' of FIG. 3.

FIG. 3 illustrates a non-volatile memory device according to example embodiments, and FIG. 4 is a cross-sectional view taken along a line IV-IV' of FIG. 3. The non-volatile memory device illustrated in FIGS. 3 and 4 may have similar features as the non-volatile memory device illustrated in FIGS. 1 and 2. Accordingly, descriptions of similar features are not provided here.

Referring to FIGS. 3 and 4, charge storage layers 155 are not limited to sidewalls of the control gate electrodes 165 between first and the second semiconductor layers 105a and 105b, and thus can extend along the first and the second semiconductor layers 105a and 105b and can be connected to each other. In this case, for example, the charge storage layers 155 may be charge-trapping type charge storage layers. Therefore, although the charge storage layers 155 are connected to each other, the charge storage layers 155 may also be operated independently of memory cells.

Figure 5:
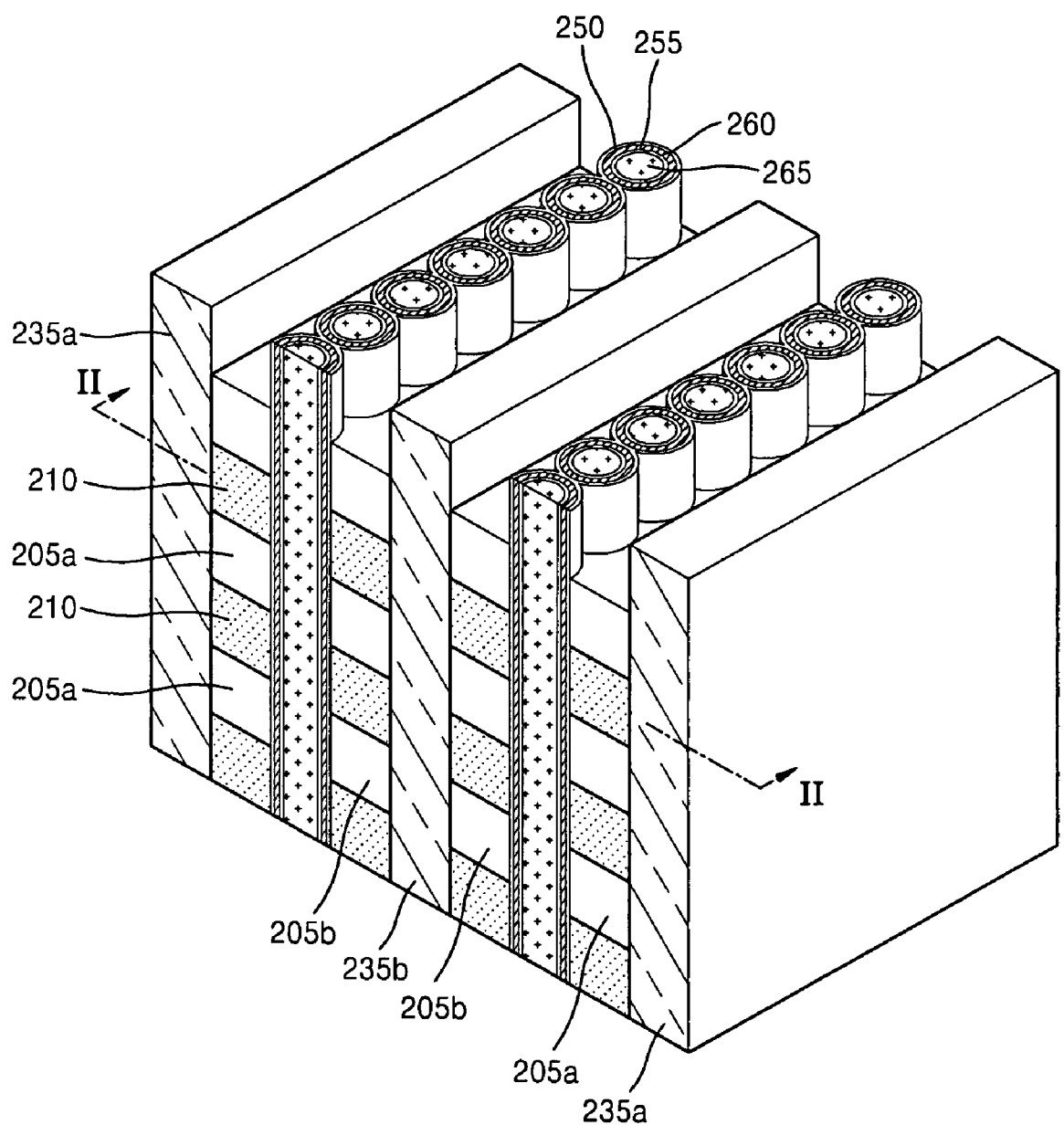
FIG. 5 illustrates a non-volatile memory device according to example embodiments.
Figure 6:
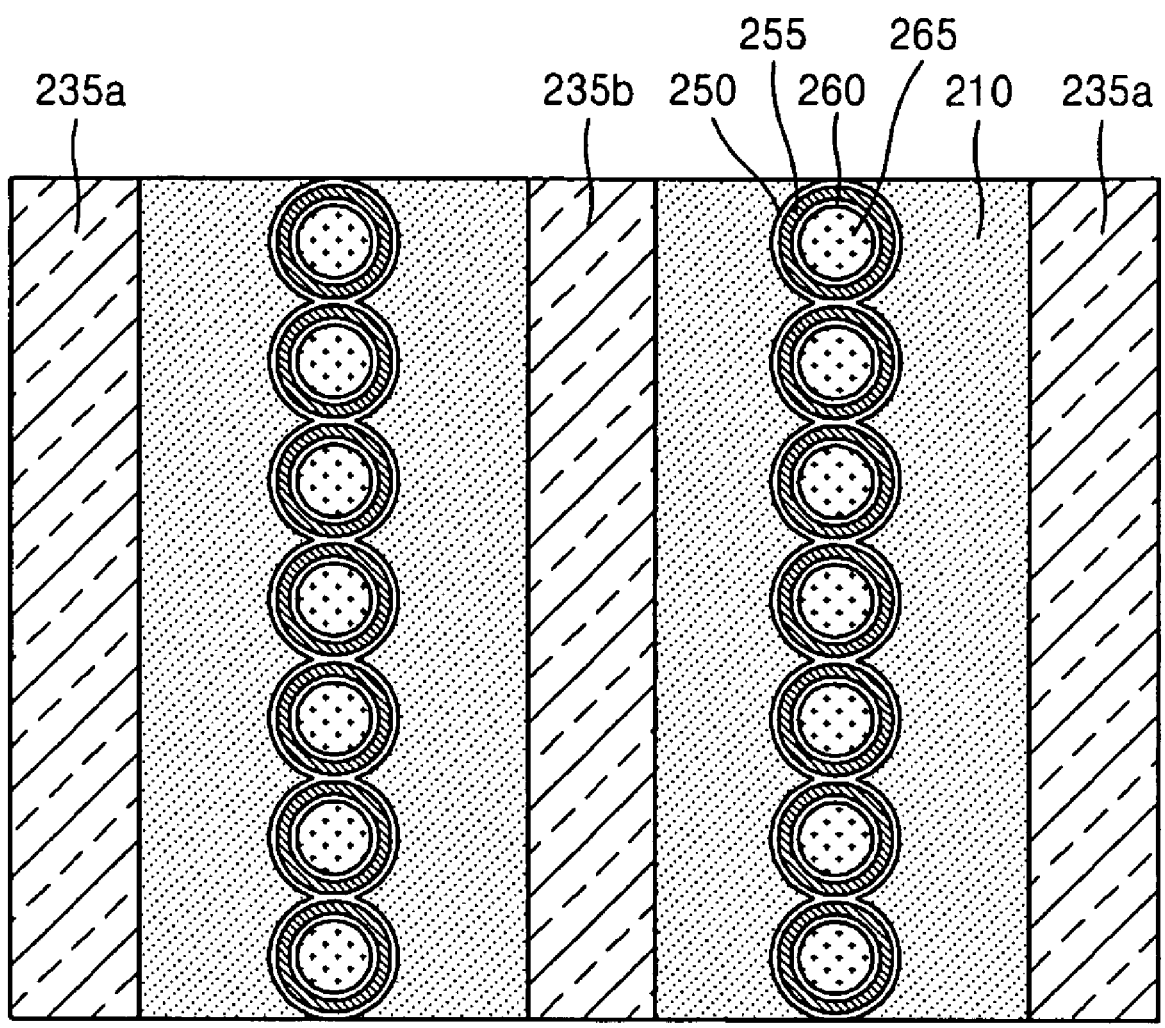
FIG. 6 is a cross-sectional view taken along a line VI-VI' of FIG. 5.

FIG. 5 illustrates an example non-volatile memory device according to example embodiments and FIG. 6 is a cross-sectional view taken along a line VI-VI' of FIG. 5.

Referring to FIGS. 5 and 6, a plurality of first semiconductor layers 205a and/or a plurality of second semiconductor layers 205b may be provided in stack structures. The first semiconductor layers 205a may be stacked by alternately interposing a plurality of device isolating layers 210 therebetween, and the second semiconductor layers 205b may be stacked by alternately interposing a plurality of device isolating layers 210 therebetween. The first and the second semiconductor layers 205a and 205b are similar to the first and the second semiconductor layers 105a and 105b of FIGS. 1 and 2, and the device isolating layers 210 are similar to the device isolating layers 110 of FIGS. 1 and 2. Therefore, descriptions of example embodiments are not provided here.

For example, a plurality of control gate electrodes 265 may be provided such that the control gate electrodes 265 extend perpendicular to the first semiconductor layers 205a and/or the second semiconductor layers 205b. The control gate electrodes 265 may be provided in a vertical penetration structure, and the first and the second semiconductor layers 205a and 205b may be provided to surround sidewalls of the control gate electrodes 265 such that they are disposed on opposite sides of the control gate electrodes 265. The control gate electrodes 265 may have a cylindrical shape, but example embodiments are not limited thereto. Moreover, the control gate electrodes 265 may be coupled with the first semiconductor layers 205a and the second semiconductor layers 205b in a NAND-type structure.

One or more first body contact layers 235a may be provided to contact and connect a surface of the first semiconductor layers 205a opposite to that facing the control gate electrodes 265, and/or one or more second body contact layers 235b may be provided to contact and connect a surface of the second semiconductor layers 205b opposite to that facing the control gate electrodes 265. Sidewalls of the device isolating layers 210 may contact the first body contact layers 235a and the second body contact layers 235b. The first and the second body contact layers 235a and 235b are similar to the first and the second body contact layers 135a and 135b of FIGS. 1 and 2. Thus, detailed descriptions of example embodiments are not provided here.

A plurality of charge storage layers 255 may be interposed between the first semiconductor layers 205a and the control gate electrodes 265 and/or between the second semiconductor layers 205b and the control gate electrodes 265. For example, the charge storage layers 255 may be disposed to surround the control gate electrodes 265. In example embodiments, the charge storage layers 255 may be shared by memory cells including the first semiconductor layers 205a and the second semiconductor layers 205b. Thus, for example, the charge storage layers 255 may be charge-trapping type charge storage layers.

A plurality of tunnelling insulation layers 250 may be interposed between the first semiconductor layers 205a and the charge storage layers 255 and/or between the second semiconductor layers 205b and the charge storage layers 255. A plurality of blocking insulation layers 260 may be interposed between the charge storage layers 255 and the control gate electrodes 265. For example, the tunnelling insulation layers 250 and the blocking insulation layers 260 may be disposed to surround the control gate electrodes 265.

The tunnelling insulation layers 250 may be disposed to be connected to each other between the first semiconductor layers 205a and the second semiconductor layers 205b. For example, two of the tunnelling insulation layers 250 adjacent to each other may be connected as well. Accordingly, the tunnelling insulation layers 250 may insulate between the first semiconductor layers 205a and the second semiconductor layers 205b. In this case, for example, radial shaped electric fields of two of the control gate electrodes 265 adjacent to each other overlap, and thus it may not be necessary to form source/drain regions using P-N junctions in the first and the second semiconductor layers 205a and 205b.

The non-volatile memory device according to example embodiments may include the advantages of the non-volatile memory device illustrated in FIGS. 1 and 2. Moreover, source/drain regions may be omitted in the first and the second semiconductor layers 205a and 205b in the non-volatile memory device according to example embodiments. Therefore, the non-volatile memory device may be highly integrated.

Figure 7:
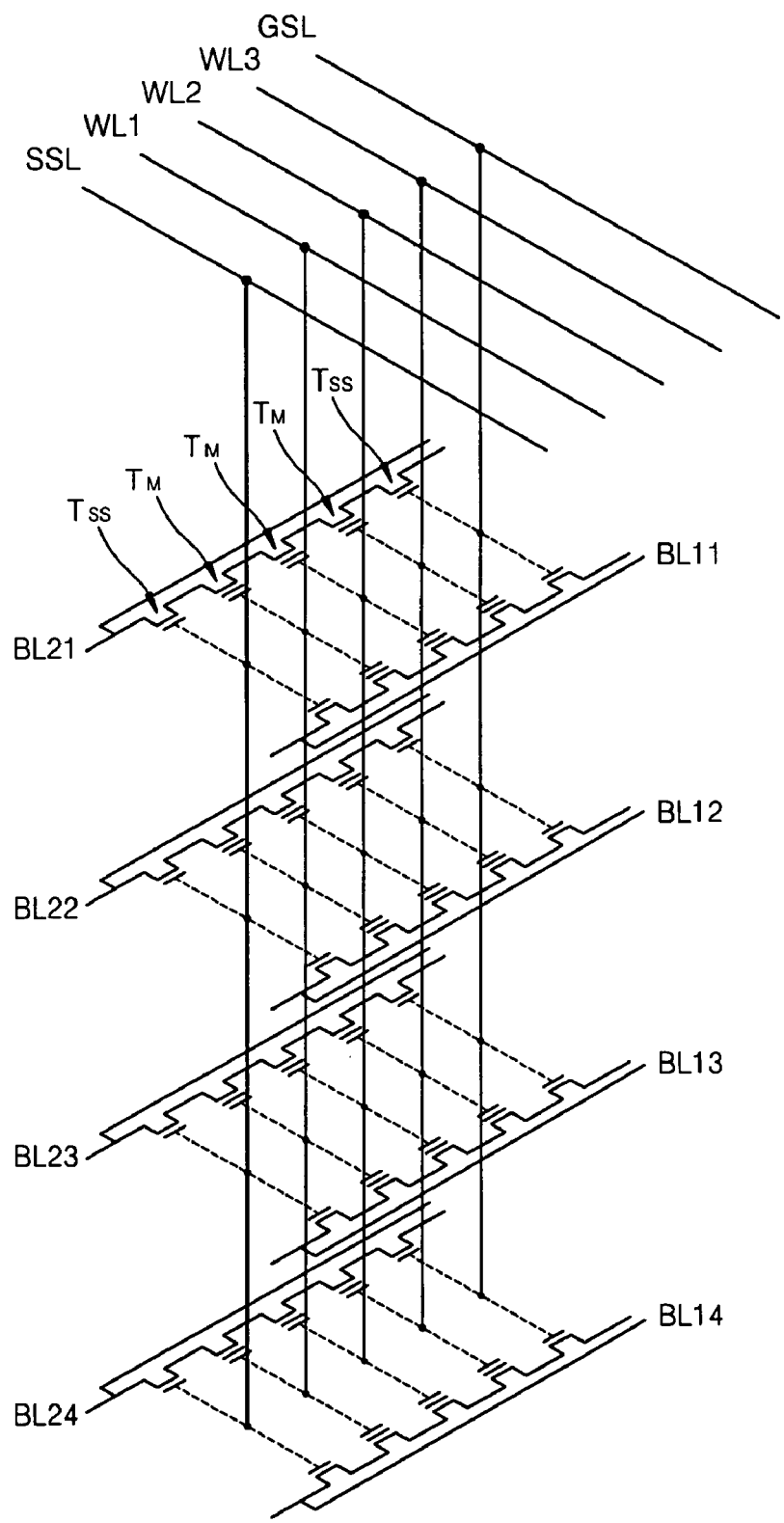
FIG. 7 is an equivalent circuit diagram of a non-volatile memory device according to example embodiments.

FIG. 7 is an example equivalent circuit diagram of a non-volatile memory device according to example embodiments.

Referring to FIG. 7, an example of a NAND-type non-volatile memory device having a four-layered stack structure is shown. Bitlines BL14 and BL24 may be connected in two rows to memory transistors $T_M$ disposed on a first layer. Bitlines BL23 and BL13 may be connected in two rows to memory transistors $T_M$ disposed on a second layer. Bitlines BL22 and BL12 may be connected in two rows to memory transistors $T_M$ disposed on a third layer. Bitlines BL21 and BL11 may be connected in two rows to memory transistors $T_M$ disposed on a fourth layer. Although the stack structure illustrated in FIG. 7 may include four layers, example embodiments are not limited thereto. Thus, number of layers in the stack structure may be chosen according to the intended storage capacity of the non-volatile memory device.

Wordlines WL1, WL2, and WL3 may be disposed such that memory transistors $T_M$ disposed on the same row of each of the layers are connected to one of the wordlines WL1, WL2, and WL3 in common. A string selecting line SSL may be connected to a string selecting transistor $T_{SS}$ of each of the layers in common, and a ground selecting line GSL may be connected to a ground selecting transistor $T_{GS}$ of each of the layers in common. Although the number of wordlines, WL1, WL2, and WL3, and the number of memory transistors, $T_M$, is three respectively, example embodiments are not limited thereto.

Table 1 shows operating conditions of the non-volatile memory device according to the example embodiments.

TABLE 1

|  | Program | Read | Erase |
|---|---|---|---|
| SSL | $V_{cc}$ | $V_{re}$ | F/T |
| SEL_WL | $V_{pgm}$ | $V_{read}$ | 0 V |
| USL_WL | $V_{pass}$ | $V_{on}$ | 0 V |
| GSL | 0 V | $V_{cc}$ | F/T |
| SEL_BL | 0 V | 1.0 V | F/T |
| USL_BL | $V_{cc}$ | 0 V | F/T |
| Bulk | 0 V | 0 V | $V_{ers}$ |

For example, a selected bitline SEL_BL may refer to a bitline selected from the bitlines BL11, BL21, BL12, BL22, BL13, BL23, BL14, and BL24, whereas unselected bitlines USL_BL may refer to the residual bitlines except the selected bitlines. For example, a selected wordline SEL_WL refers to a wordline selected from the wordlines WL1, WL2, and WL3, whereas unselected wordlines USL_WL, may refer to the residual bitlines except the selected wordlines. A bulk Bulk refers to bodies of the memory cells $T_M$, which may be the first and the second body contact layers 135a, 135b, 235a, and 235b of FIGS. 1 through 6.

A programming operation may be performed by applying a programming voltage $V_{pgm}$ to the selected wordline SEL_WL and applying a passing voltage $V_{pass}$ to the unselected wordlines USL_WL. In this case, for example, an operating voltage $V_{cc}$ may be applied to the string selecting line SSL and the unselected bitlines USL_BL, and 0V may be applied to the ground selecting line GSL, the selected bitlines SEL_BL, and the bulk Bulk.

A reading operation may be performed by applying a reading voltage $V_{read}$ to the selected wordline SEL_WL and applying a second passing voltage $V_{on}$ to the unselected wordlines USL_WL. In this case, for example, the operating voltage $V_{cc}$ may be applied to the ground selecting line GSL, 0V may be applied to the unselected bitlines USL_BL and the bulk Bulk, and a second operating voltage $V_{re}$ may be applied to the selected bitlines SEL_BL.

Figure 21:
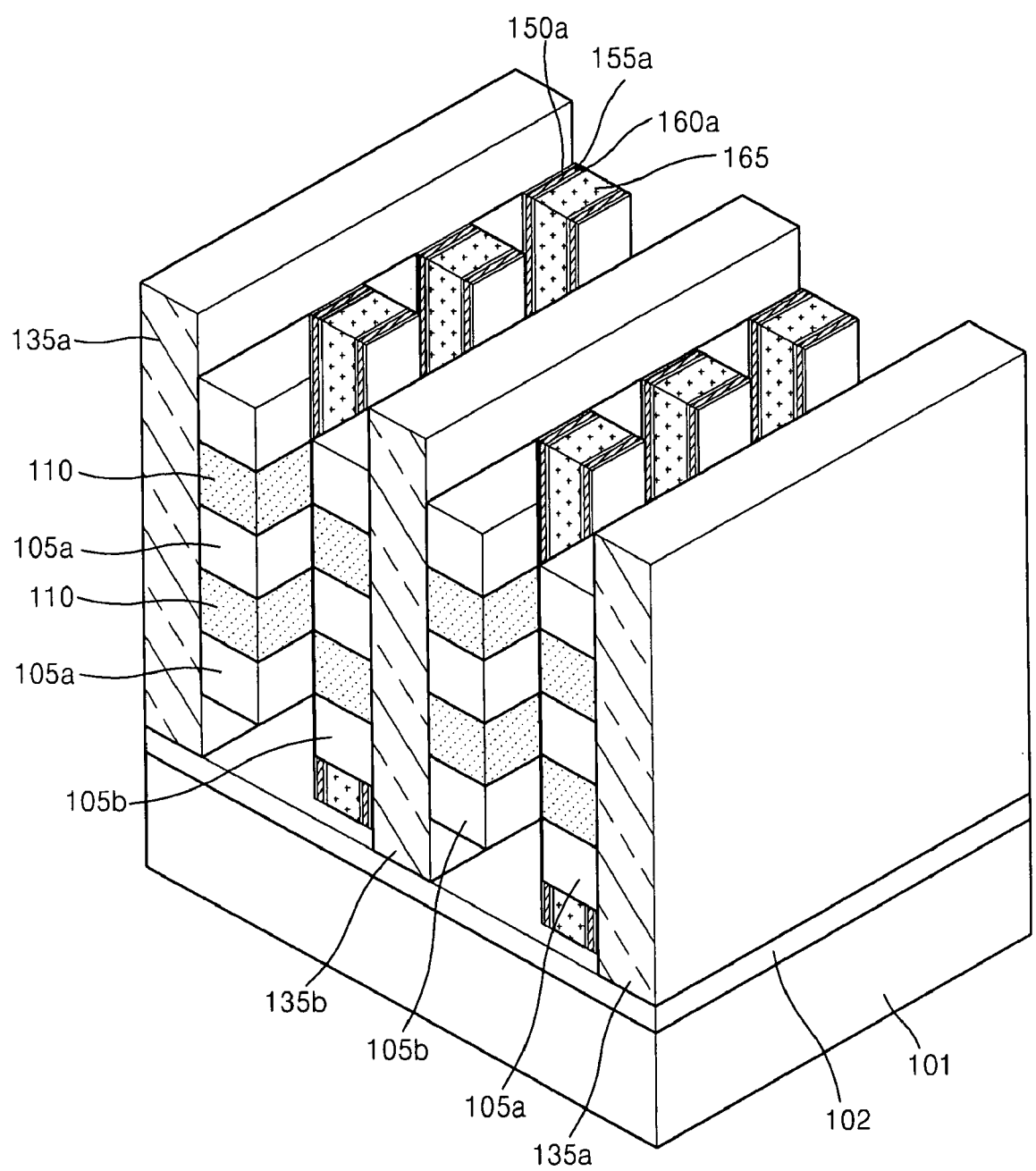
FIG. 21 illustrates a non-volatile memory device according to example embodiments.

An erasing operation may be performed by applying 0V to the selected wordline SEL_WL and the unselected wordlines USL_WL and applying an erasing voltage $V_{ers}$ to the bulk Bulk. In this case, for example, the string selecting line SSL, the ground selecting line GSL, the selected wordline SEL_WL, and the unselected wordlines USL_WL may be floated (indicated as F/T). FIG. 21 illustrates a non-volatile memory device according to example embodiments.

Referring to FIG. 21, the structures of non-volatile memory devices according to example embodiments, such as the non-volatile memory device in FIG. 1 may be formed on a substrate 101. For example, the substrate 101 may include a semiconductor wafer made of semiconductor materials, such as Si, Ge or Si—Ge, etc. The first and second semiconductor layers 105a and 105b may be vertically stacked on the substrate 101. The control gate electrodes 165 may extend vertically on the substrate 101 to across the first and second semiconductor layers 105a and 105b. The first and second body contact layers 135a and 135b may extend vertically on the substrate 101 to across the first and second semiconductor layers 105a and 105b. For example, a insulating layer 102 may be provided between the control gate electrodes 165 and the semiconductor substrate 101 and between the first and second body contact layers 135a and 135b and the semiconductor substrate 101.

FIGS. 8 through 15 are example perspective views illustrating a method of manufacturing a non-volatile memory device, according to example embodiments.

Figure 8:
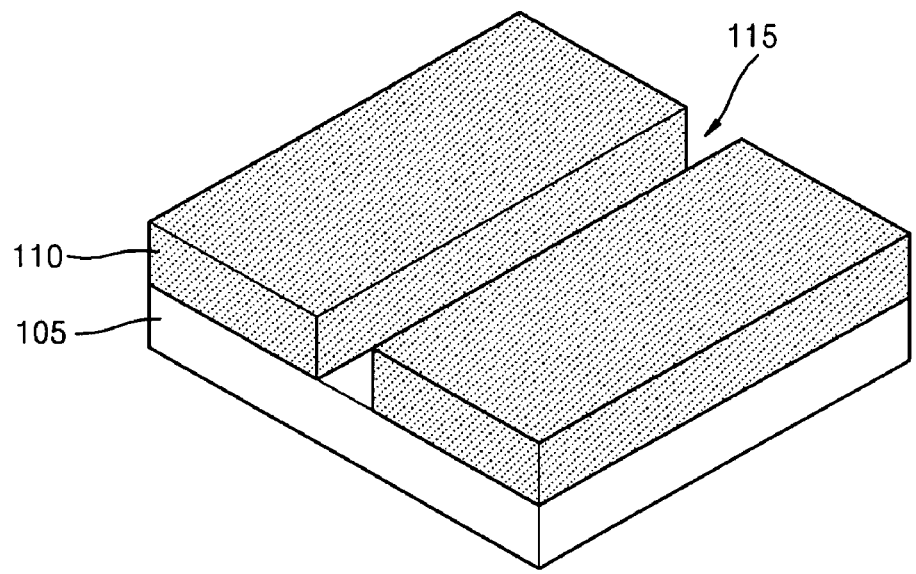
FIGS. 8 through 15 illustrate a method of manufacturing a non-volatile memory device, according to example embodiments.

Referring to FIG. 8, device isolating layers 110 may be patterned on a semiconductor layer 105 such that a trench 115 may be formed exposing a portion of the semiconductor layer 105 between the device isolating layers 110. For example, the device isolating layers 110 may be formed by forming a suitable insulation layer (not shown) on the semiconductor layer 105 and patterning the insulation layer using a photolithography and/or an etching technique or any other known technique. Although only one trench 115 is illustrated in FIG. 8, example embodiments are not limited thereto, and a plurality of trenches may be successively formed.

The semiconductor layer 105 may be a portion of a substrate or an epitaxial layer. In example embodiments, an epitaxial layer, for example, may refer to a single crystal layer conformally grown from a lower single crystal layer.

Figure 9:
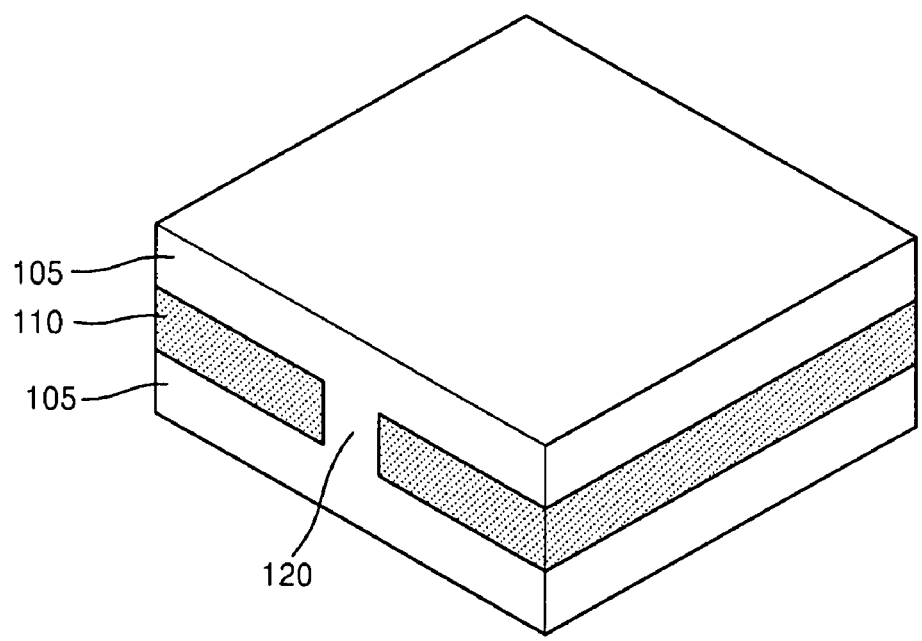

Referring to FIG. 9, a vertical connecting layer 120 may be formed in the trench 115. For example, the vertical connecting layer 120 may be an epitaxial layer grown from the semiconductor layer 105. As stated above, because the number of trenches formed may not be limited, a plurality of vertical connecting layers may be disposed on the semiconductor layer 105. The vertical connecting layer 120 may be formed of the same material as the semiconductor layer 105 or a material having a lattice constant similar to that of a material forming the semiconductor layer 105. For example, silicon and silicon-germanium have lattice constants similar to each other, and thus one of them may grow as an epitaxial layer from the other.

Referring to FIG. 9 again, another portion of the semiconductor layer 105 may be formed over the vertical connecting layer 120. The semiconductor layer 105 may be formed using an epitaxial lateral overgrowth (ELO) method. For example, the semiconductor layer 105 may be formed as an epitaxial layer growing upward from the vertical connecting layer 120 and sideward onto the device isolating layers 110.

An example vertical connecting layer 120 and the semiconductor layer 105 may be grown into an epitaxial layer at the same instance.

Figure 10:
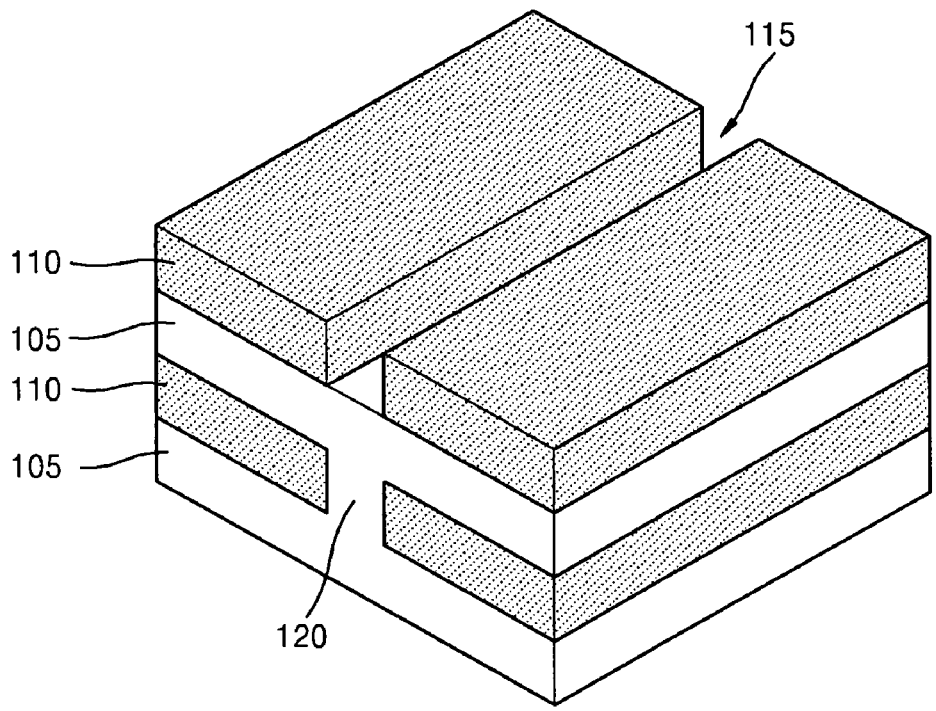

Referring to FIG. 10, further device isolating layers 110 may be formed on the semiconductor layer 105.

Figure 11:
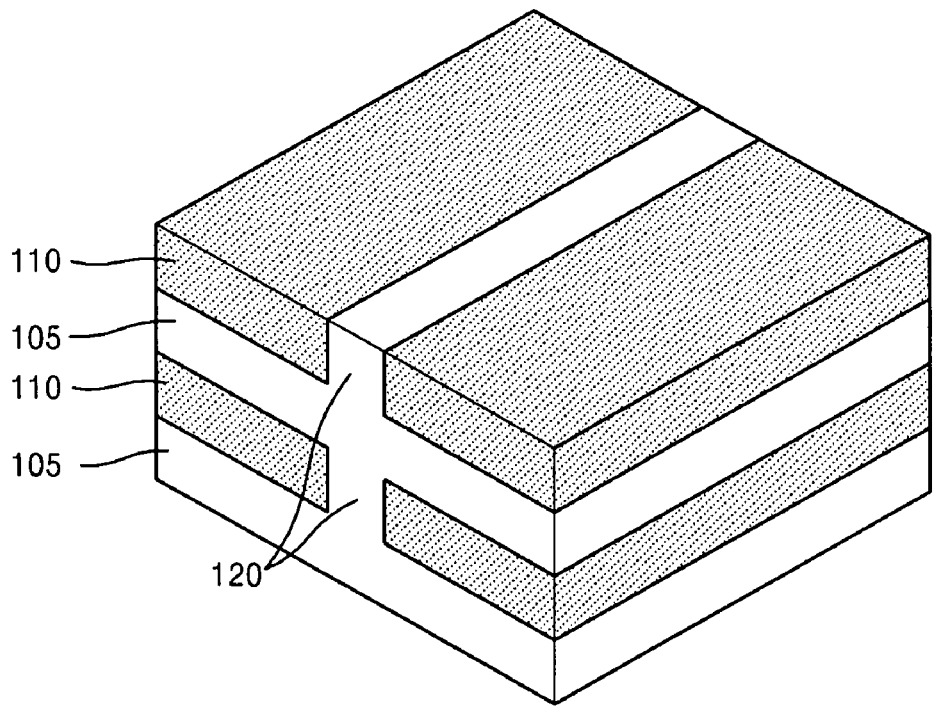

Referring to FIG. 11, another portion of the vertical connecting layer 120 may be formed on a portion of the semiconductor layer 105 exposed between the device isolating layers 110.

Figure 12:
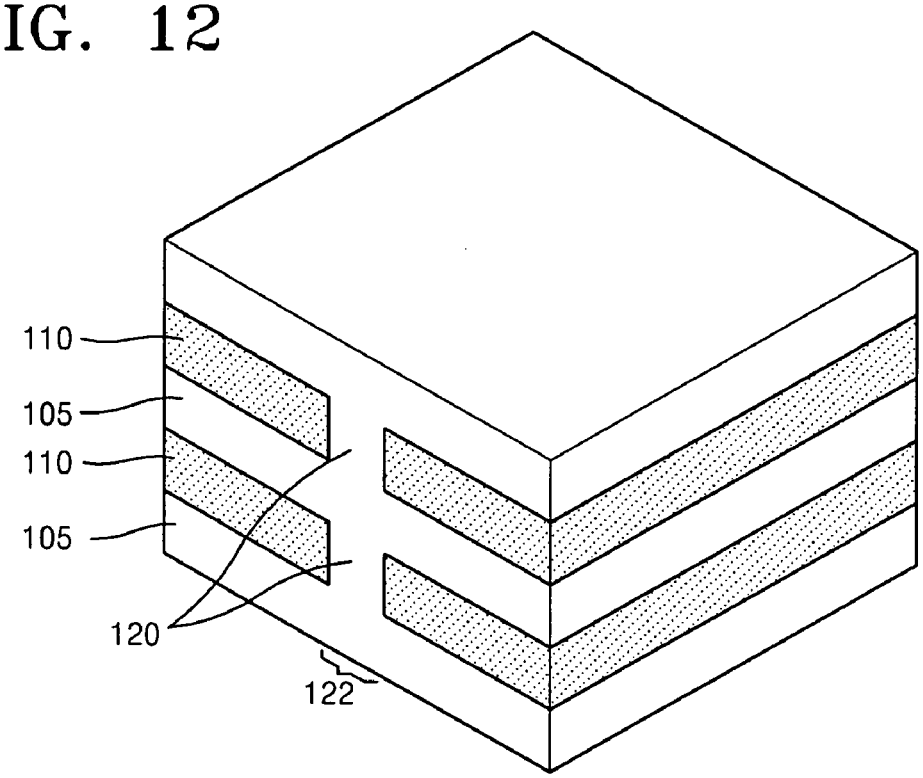

Referring to FIG. 12, another portion of the semiconductor layer 105 may be formed on the vertical connecting layer 120 by using an ELO method. A vertical epitaxial layer 122 may refer to portions, including the vertical connecting layers 120, grown perpendicular to the semiconductor layer 105. Only one vertical epitaxial layer 122 is illustrated in FIG. 12, but example embodiments are not limited thereto, and a plurality of vertical epitaxial layers 122 may be disposed.

Figure 13:
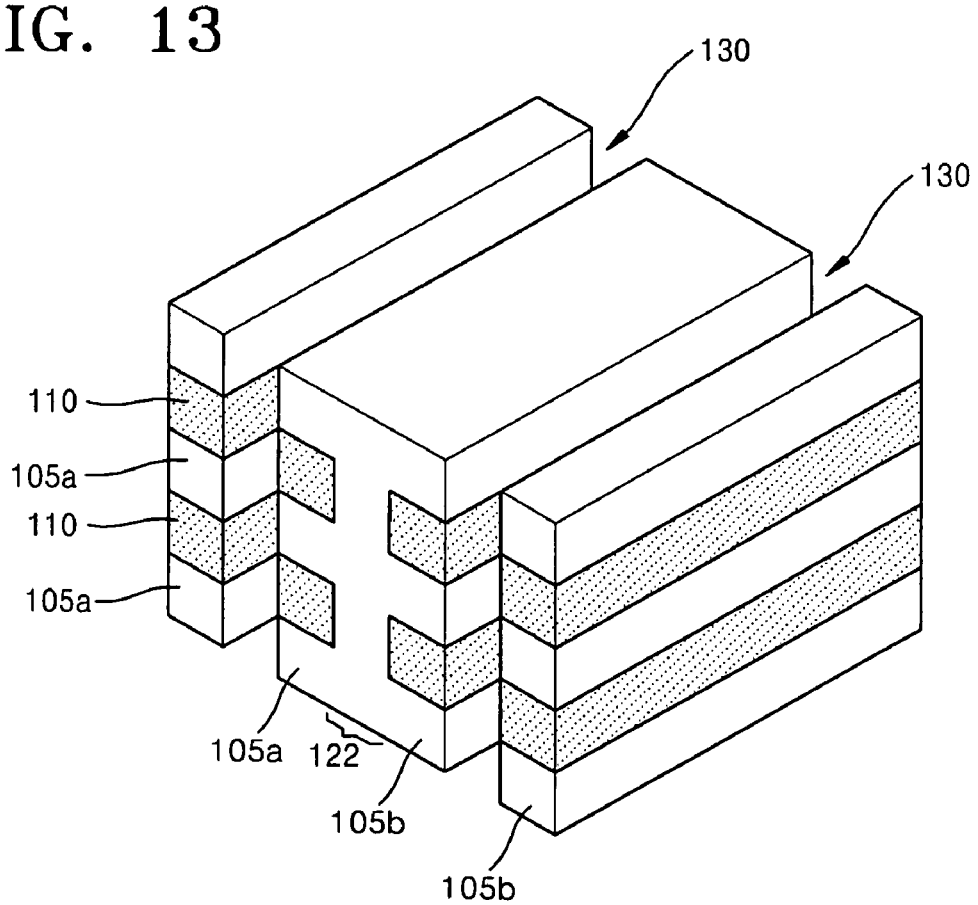

Referring to FIG. 13, trenches 130 may be formed at both sides of the vertical epitaxial layer 122. The trenches 130 may be formed by patterning the semiconductor layers 105 and the device isolating layers 110 by using a photolithography and/or an etching technique. First semiconductor layers 105a and second semiconductor layers 105b may be simultaneously formed, for example, on either side of the trenches 130.

Figure 14:
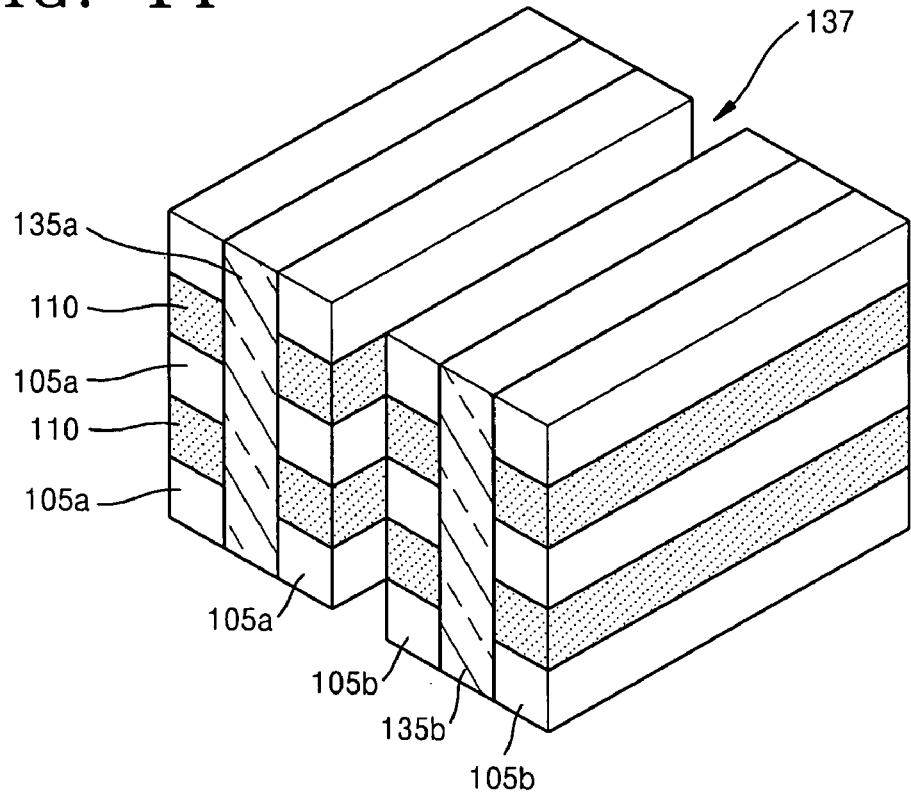

Referring to FIG. 14, first and second body contact layers 135a and 135b may be formed in the respective trenches 130, and the vertical epitaxial layer 122 may be selectively removed. For example, the first body contact layers 135a may be formed perpendicular to the first semiconductor layers 105a such that the first semiconductor layers 105a are connected to each other. The second body contact layers 135b may be formed perpendicular to the second semiconductor layers 105b such that the second semiconductor layers 105b may be connected to each other. The first and the second body contact layers 135a and 135b may be formed as conductive layers including a metal, a metal-silicide, or a doped semiconductor material.

The vertical epitaxial layer 122 may be removed using a photolithography and/or an etching technique. For example, as the vertical epitaxial layer 122 may be removed, a trench 137 may be formed between sidewalls of the first and the second semiconductor layers 105a and 105b opposite to the first and the second body contact layers 135a and 135b The removal of the vertical epitaxial layer 122 and the formation of the first and the second body contact layers 135a and 135b may be performed in any sequence.

Figure 15:
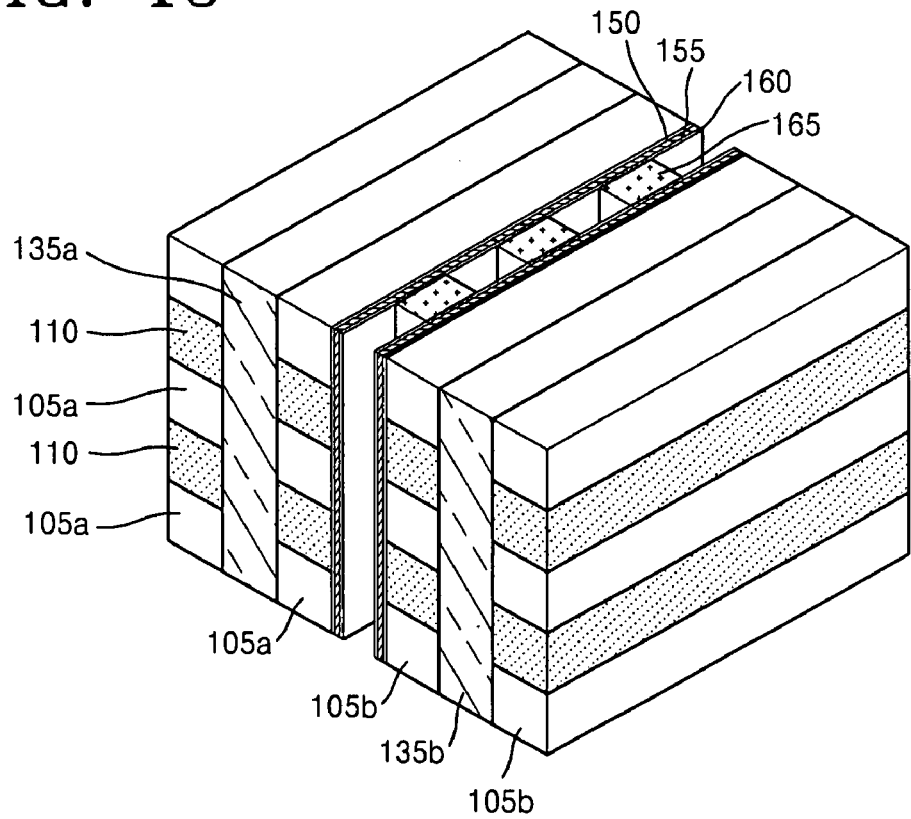

Referring to FIG. 15, tunnelling insulation layers 150 may be formed on sidewalls of the first and the second semiconductor layers 105a and 105b in the trench 137, charge storage layers 155 may be formed on the tunnelling insulation layers 150, and blocking insulation layers 160 may be formed on the charge storage layers 155. Furthermore, control gate electrodes 165 may be formed on the blocking insulation layers 160. For example, the control gate electrodes 165 may be formed by forming a conductive layer on the blocking insulation layers 160 to fill the trench 137 and patterning the conductive layer.

According to example embodiments, as shown in FIG. 1 for example, the tunnelling insulation layers 150, the charge storage layers 155, and the blocking insulation layers 160 may be patterned together when the control gate electrodes 165 are being patterned.

According to the method of example embodiments, first and second body contact layers 135a and 135b may be formed together with the first and the second semiconductor layers 105a and 105b. Moreover, because sidewalls of the first and the second semiconductor layers 105a and 105b facing the control gate electrodes 165 may be formed in the beginning of the epitaxial lateral overgrowth, the sidewalls of the first and the second semiconductor layers 105a and 105b facing the control gate electrodes 165 may be used as a high-quality channel region.

Figure 16:
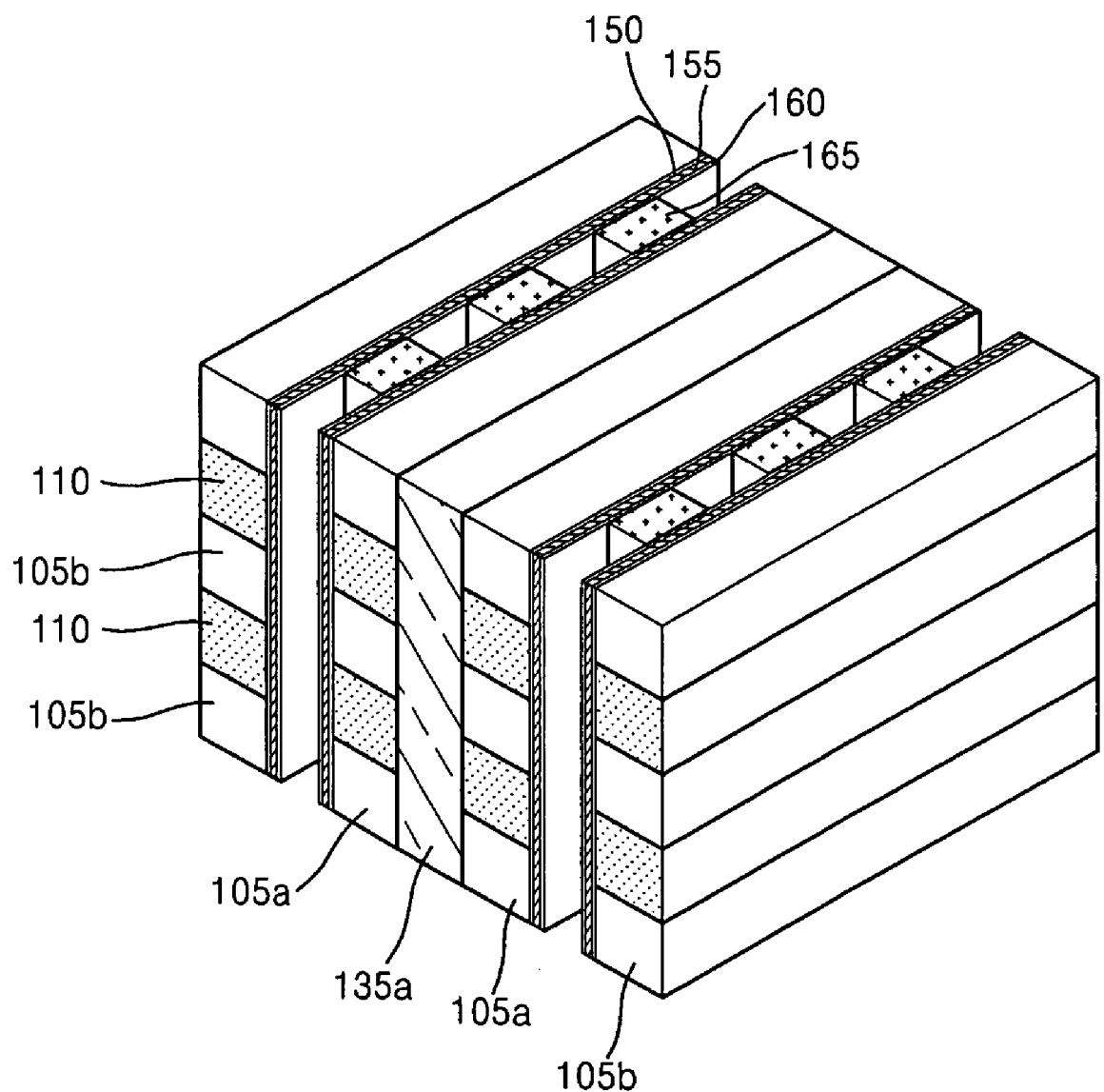
FIG. 16 is an example perspective view for explaining a method of manufacturing a non-volatile memory device, according to example embodiments.

FIG. 16 is a perspective view, for example, explaining a method of manufacturing a non-volatile memory device, according to example embodiments. Example embodiments may be a modification of the method illustrated in FIGS. 8 through 15. Thus, descriptions overlapping these example embodiments are not provided in the description of the method referring to FIG. 16. Furthermore, steps illustrated in FIG. 16 may be performed after steps illustrated in FIG. 13.

Referring to FIG. 16, the tunnelling insulation layers 150, the charge storage layers 155, the blocking insulation layers 160, and the control gate electrodes 165 may be formed in the trenches 130, as illustrated in FIG. 15. In this case, for example, the vertical epitaxial layer 122 of FIG. 13 may be equal to the first body contact layer 135a or the second body contact layer 135b. As illustrated in FIG. 12, if a plurality of vertical epitaxial layers are disposed, the vertical epitaxial layers may become a repeating structure of the first and the second body contact layers 135a and 135b.

Figure 17:
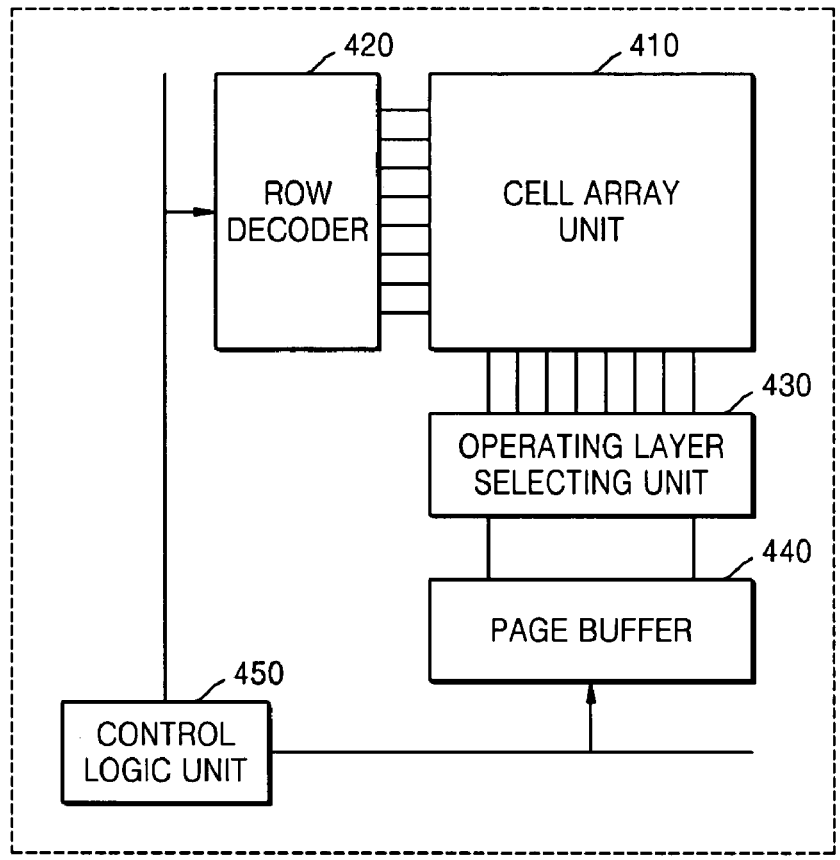
FIG. 17 is a schematic block diagram illustrating a non-volatile memory device according to example embodiments.

FIG. 17 is a schematic block diagram illustrating a non-volatile memory device according to example embodiments.

Referring to FIG. 17, the non-volatile memory device according to example embodiments may include a cell array unit 410, a row decoder 420, an operating layer selecting unit 430, a page buffer 440, and a control logic unit 450. The cell array unit 410 may have a stack structure of memory cells. For example, the cell array unit 410 may include one of the non-volatile memory device shown in FIGS. 1 through 16 and 21 or array structure thereof.

The row decoder 420 may be connected to wordlines of the cell array unit 410, and the operating layer selecting unit 430 may be connected to bitlines of the cell array unit 410. The page buffer 440 may be connected to the bitlines of the cell array unit 410 via the operating layer selecting unit 430. The operating layer selecting unit 430 may function to connect bitlines connected to selected layers in the stack structure of the cell array unit 410 to the page buffer 440. The control logic unit 450 may control the row decoder 420 and the page buffer 440.

Figure 18:
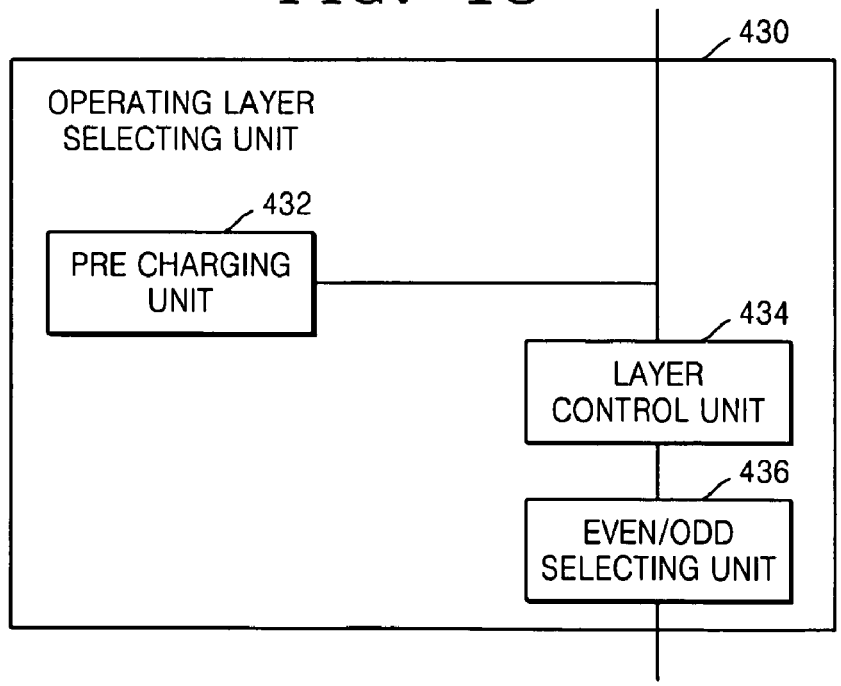
FIG. 18 is a schematic block diagram illustrating an operating layer selecting unit in the non-volatile memory device of FIG. 17, according to example embodiments.

FIG. 18 is a schematic block diagram illustrating the operating layer selecting unit 430 in the non-volatile memory device of FIG. 17, according to example embodiments.

Referring to FIG. 18, the operating layer selecting unit 430 may include a pre-charging unit 432, a layer control unit 434, and/or an even/odd selecting unit 436. The pre-charging unit 432 may charge the bitlines of the cell array region 410 to a boosting voltage. The layer control unit 434 may control electrical connections between the bitlines of the cell array unit 410 and the page buffer 440. The even/odd selecting unit 436 may be provided between the layer control unit 434 and the page buffer 440, and is capable of distinguishing bitlines disposed on the same layer into even bitlines and odd bitlines.

Figure 19:
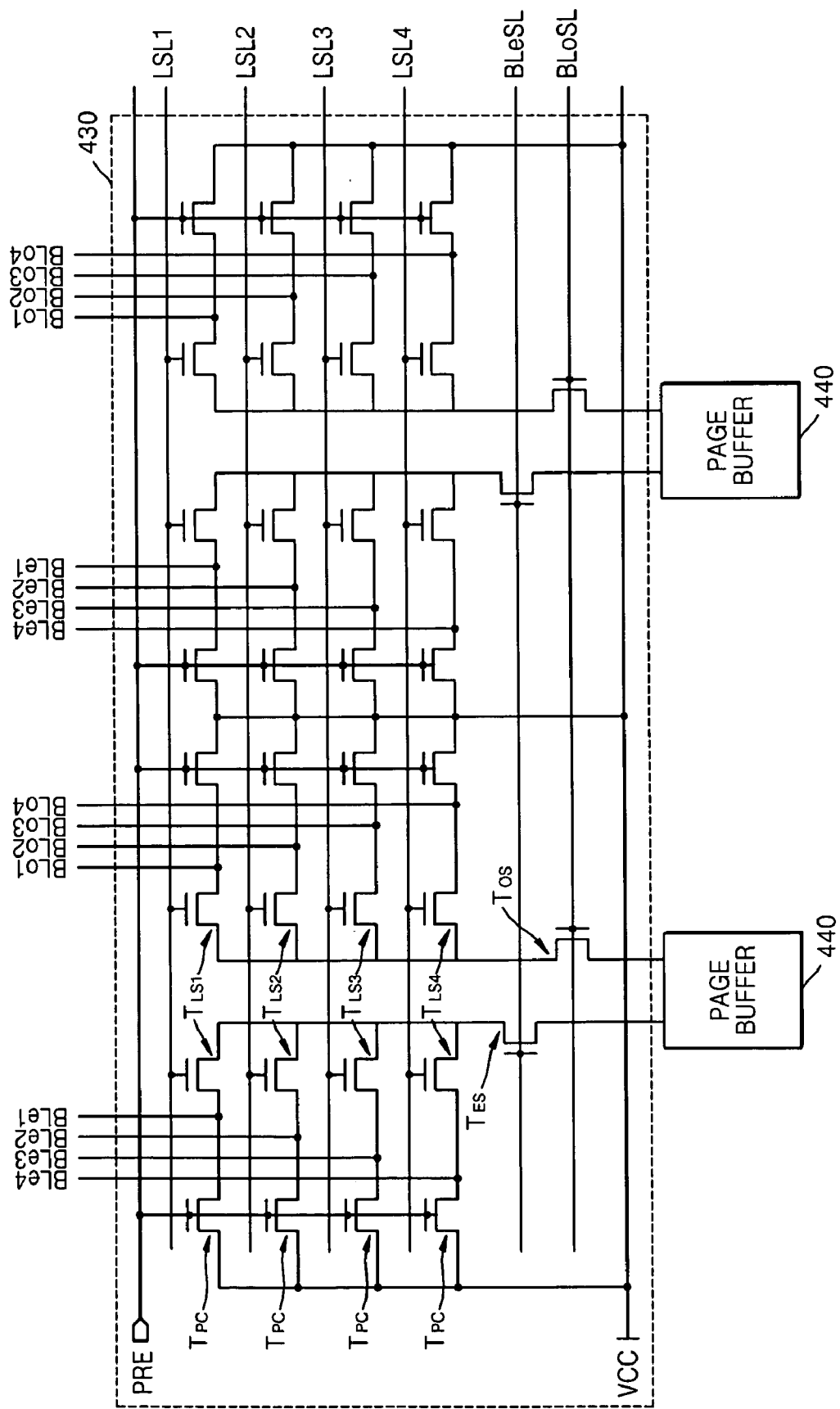
FIG. 19 is a circuit diagram illustrating an example of the operating layer selecting unit and a page buffer of the non-volatile memory device of FIG. 17, according to example embodiments.

FIG. 19 is a circuit diagram illustrating an example of the operating layer selecting unit 430 and the page buffer 440 of the non-volatile memory device of FIG. 17, according to example embodiments.

Referring to FIGS. 18 and 19, the pre-charging unit 432 may include a plurality of first transistors $T_{PC}$ connected between bitlines BLe1, BLe2, BLe3, BLe4, BLo1, BLo2, BLo3, and BLo4 and a power supply source and a pre-charging line PRE for controlling the first transistors $T_{PC}$. When a turn-on voltage is applied to the pre-charging line PRE, the first transistors $T_{PC}$ are turned on, and the bitlines BLe1, BLe2, BLe3, BLe4, BLo1, BLo2, BLo3, and BLo4 may be charged by a boosting voltage Vcc. The number of the bitlines BLe1, BLe2, BLe3, BLe4, BLo1, BLo2, BLo3, and BLo4 illustrated in FIG. 19 is an example, and thus the number of bitlines may vary according to the intended or desired capacity of the non-volatile memory device.

The layer control unit 434 may include a plurality of second transistors $T_{LS1}$, $T_{LS2}$, $T_{LS3}$, and $T_{LS4}$ and a plurality of layer selecting lines LSL1, LSL2, LSL3, and LSL4. The second transistor $T_{LS1}$ may be interconnected between the bitlines BLe1 and Blo1 and the page buffer 440, and may be controlled by the layer selecting line LSL1. The second transistor $T_{LS2}$ may be interconnected between the bitlines BLe2 and Blo2 and the page buffer 440, and may be controlled by the layer selecting line LSL2. The second transistor $T_{LS3}$ may be interconnected between the bitlines BLe3 and Blo3 and the page buffer 440, and may be controlled by the layer selecting line LSL3. The second transistor $T_{LS4}$ may be interconnected between the bitlines BLe4 and Blo4 and the page buffer 440, and may be controlled by the layer selecting line LSL4.

The even/odd selecting unit 436 may include third transistors $T_{OS}$ and $T_{ES}$, an odd selecting line BLoSL, and an even selecting ling BLesL. The third transistor $T_{OS}$ may be connected between the second transistors $T_{LS1}$, $T_{LS2}$, $T_{LS3}$, and $T_{LS4}$ and the page buffer 440, and may be controlled by the odd selecting line BLoSL. The third transistor $T_{ES}$ may be connected between the second transistors $T_{LS1}$, $T_{LS2}$, $T_{LS3}$, and $T_{LS4}$ and the page buffer 440, and may be controlled by the even selecting line BLeSL.

According to example embodiments, the bitlines BLe1, BLe2, BLe3, BLe4, BLo1, BLo2, BLo3, and BLo4 can be first charged with the boosting voltage Vcc by using the pre-charging unit 432. One of the second transistors $T_{LS1}$, $T_{LS2}$, $T_{LS3}$, and $T_{LS4}$ corresponding to the selected layer may be turned on by using the layer selecting unit 434 to connect the selected bitline to the page buffer 440. Accordingly, the selected bitline may be discharged. Therefore, only selected bitlines may be programmed.

Figure 20:
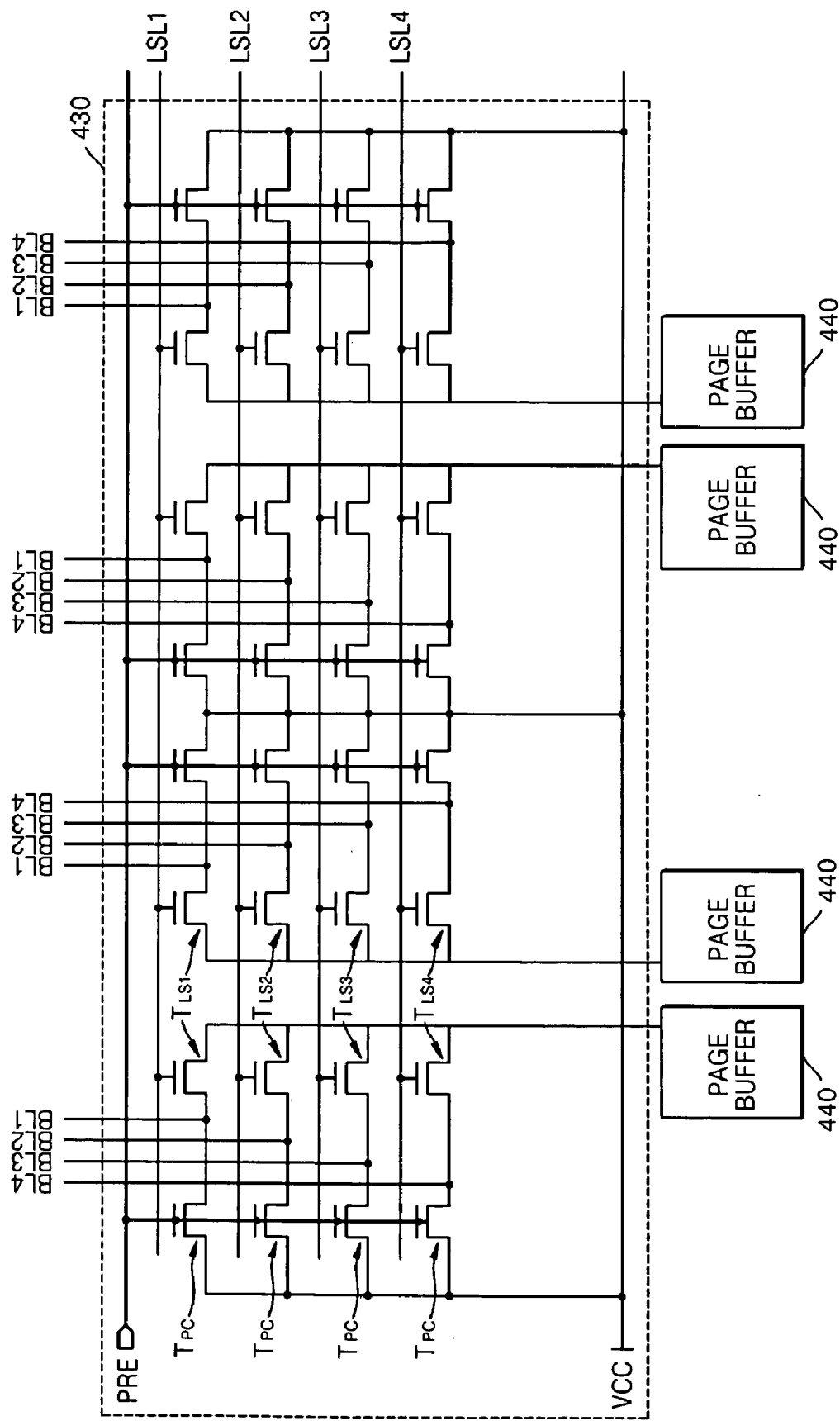
FIG. 20 is a circuit diagram illustrating the operating layer selecting unit and the page buffer of the non-volatile memory device of FIG. 17, according example embodiments.

FIG. 20 is a circuit diagram illustrating the operating layer selecting unit 430 and the page buffer 440 of the non-volatile memory device of FIG. 17, according to example embodiments.

Referring to FIG. 20, bitlines BL1, BL2, BL3, and BL4 may be combined with the page buffer 440. Therefore, the even/odd selecting unit 436 may be omitted in this case.

While example embodiments have been particularly shown and described with reference to FIGS. 1-20, it will be understood by those of ordinary skill in the art that various changes in form and details may be made without departing from the spirit and scope of example embodiments as defined by the following claims.

What is claimed is:

1. A non-volatile memory device comprising:
   a plurality of first semiconductor layers having a stack structure;
   a plurality of control gate electrodes extending across the first semiconductor layers;
   a plurality of first body contact layers extending across the first semiconductor layers to contact a surface of the first semiconductor layers facing opposite to the control gate electrodes; and
   a plurality of charge storage layers between the control gate electrodes and the first semiconductor layers.

2. The non-volatile memory device of claim 1, further comprising a plurality of device isolating layers interposed between the first semiconductor layers and contacting the first body contact layers.

3. The non-volatile memory device of claim 1, wherein the charge storage layers extend along the first semiconductor layers.

4. The non-volatile memory device of claim 1, further comprising a plurality of second semiconductor layers disposed at a side of the control gate electrodes facing opposite to the first semiconductor layers.

5. The non-volatile memory device of claim 4, further comprising a plurality of device isolating layers interposed between the second semiconductor layers and contacting a plurality of second body contact layers.

6. The non-volatile memory device of claim 4, further comprising a plurality of second body contact layers extending across the second semiconductor layers to contact a surface of the second semiconductor layers facing opposite to the control gate electrodes.

7. The non-volatile memory device of claim 4, further comprising:
   a plurality of tunneling insulation layers interposed between the charge storage layers and the first and the second semiconductor layers; and
   a plurality of blocking insulation layers interposed between the charge storage layers and the control gate electrodes.

8. The non-volatile memory device of claim 7, wherein the charge storage layers are disposed to surround the control gate electrodes.

9. The non-volatile memory device of claim 8, wherein the tunneling insulation layers extend along the first semiconductor layers.

* * * * *